United States Patent
Seidl et al.

(10) Patent No.: US 10,749,338 B2
(45) Date of Patent: Aug. 18, 2020

(54) ESD POWER CLAMP WITH NEGATIVE GATE VOLTAGE

(71) Applicant: Infineon Technologies AG, Neubiberg (DE)

(72) Inventors: Stefan Seidl, Munich (DE); David Alvarez, Munich (DE)

(73) Assignee: Infineon Technologies AG, Neubiberg (DE)

( * ) Notice: Subject to any disclaimer, the term of this patent is extended or adjusted under 35 U.S.C. 154(b) by 270 days.

(21) Appl. No.: 15/902,216

(22) Filed: Feb. 22, 2018

(65) Prior Publication Data

US 2019/0260203 A1 Aug. 22, 2019

(51) Int. Cl.
| | | |
|---|---|---|
| *H02H 9/04* | (2006.01) | |
| *H02H 1/00* | (2006.01) | |
| *H01L 27/02* | (2006.01) | |
| *H01L 27/06* | (2006.01) | |
| *H02M 3/07* | (2006.01) | |

(52) U.S. Cl.
CPC ......... *H02H 9/046* (2013.01); *H01L 27/0266* (2013.01); *H01L 27/0274* (2013.01); *H02H 1/0007* (2013.01); *H01L 27/0629* (2013.01); *H02M 3/07* (2013.01)

(58) Field of Classification Search
CPC .. H02H 9/046; H02H 1/0007; H01L 27/0274; H01L 27/0266; H01L 27/0629; H02M 3/07
USPC .......................................................... 361/56
See application file for complete search history.

(56) References Cited

U.S. PATENT DOCUMENTS

| 5,747,834 A | 5/1998 | Chen et al. | |
|---|---|---|---|
| 2009/0195951 A1* | 8/2009 | Sorgeloos | H02H 9/046 361/56 |

OTHER PUBLICATIONS

Choi, et al., "A Comparison Study of Input ESD Protection Schemes Utilizing NMOS, Thyristor, and Diode Devices," Communication and Network, 2010, Feb. 2010, pp. 11-25.
Schmidt, "FETs (Field-Effect Transitors)," Motley Electronic Topics, Jun. 20, 2017, 12 pp.

* cited by examiner

*Primary Examiner* — Dharti H Patel
(74) *Attorney, Agent, or Firm* — Shumaker & Sieffert, P.A.

(57) ABSTRACT

Techniques for electrostatic discharge (ESD) protection that apply a negative voltage to an MOS power clamp during an ESD event. The power clamp may be initially turned on by a short positive pulse to the gate to trigger the power clamp to switch into a parasitic bipolar mode, to quickly shunt the electrical energy from the ESD event around other circuitry. However, repeatedly triggering an NMOS power clamp into bipolar mode may cause the power clamp performance to degrade. For example, the NMOS power clamp may develop an increase in leakage current. The techniques of this disclosure apply a negative voltage to the gate of the power clamp which may reduce the holding and triggering voltage during the ESD event as well as improve leakage degradation of the power clamp after repeated ESD events.

20 Claims, 10 Drawing Sheets

ESD POWER CLAMP WITH NEGATIVE GATE VOLTAGE

TECHNICAL FIELD

The disclosure relates to electrostatic discharge (ESD) protection for integrated circuits.

BACKGROUND

To protect devices, such as integrated circuits (IC), against electrostatic discharges (ESD), in some examples, a power clamp may be placed between the supply and the ground line to limit the ESD voltage below a destructive level. A metal oxide semiconductor (MOS) transistor may be used as a shunt path in a power clamp as a MOS transistor may be triggered in a controlled way. ESD currents may be in the range of several amperes, so for an IC the MOS transistor may use a width of many millimeters or a smaller MOS transistor device may be used in the parasitic bipolar mode to shunt the ESD current.

SUMMARY

In general, the disclosure is directed to techniques for electrostatic discharge (ESD) protection that applies a negative voltage, to a metal oxide semiconductor (MOS) power clamp during an ESD event. The techniques of this disclosure may include applying a positive voltage to the gate of an NMOS power clamp before the negative voltage to trigger the power clamp to switch into a parasitic bipolar mode, which may quickly shunt the electrical energy from the ESD event around other circuitry. To save area on an integrated circuit (IC) the bipolar mode may be used, rather than a larger MOS transistor. However, repeatedly triggering an NMOS power clamp into bipolar mode may cause the power clamp performance to degrade. For example, the NMOS power clamp may develop an increase in leakage current. For NMOS power clamps connected between a power supply and ground, this may cause undesired power consumption. In the example of a battery powered circuit, leakages in the power clamp may prematurely drain the battery. Applying a negative voltage to the power clamp gate may reduce the performance degradation.

The techniques of this disclosure may include applying a negative voltage to the power clamp during the ESD event. In some examples, the techniques may also include applying a positive voltage pulse followed by the negative voltage. An ESD event may be on the order of a hundred nanoseconds (ns). The positive gate voltage may reduce the triggering voltage of the bipolar mode of the NMOS power clamp.

In one example, the disclosure is directed to a method of electrostatic discharge (ESD) protection, the method comprising: detecting, by an ESD protection circuit, an ESD pulse. In response to detecting the ESD pulse, applying, by the ESD protection circuit, a negative voltage to the gate of the ESD clamping device, wherein the ESD clamping device carries the ESD current generated by the ESD pulse, and wherein electrical energy for the positive voltage and the negative voltage is generated by the ESD pulse.

In another example, the disclosure is directed to a charge pump circuit comprising an output element, an energy storage element, wherein a first terminal of the energy storage element connects to the output element, and a driver circuit configured to: charge the energy storage element from a supply voltage at a first time, switch the energy storage element connections such that the first terminal of the energy storage element outputs a positive voltage at the first time and outputs a negative voltage at a second time.

In another example, the disclosure is directed to an electrostatic discharge (ESD) protection circuit, the circuit comprising; an ESD clamping device comprising a gate and a conduction path, wherein the conduction path connects a circuit power supply to a circuit ground; and a charge pump circuit comprising: an output element, wherein the output element of the charge pump circuit connects to the gate of the ESD power clamp, an energy storage element, wherein a first terminal of the energy storage element connects to the output element, and a driver circuit configured to: charge the energy storage element from a supply voltage at a first time; and switch the second terminal such that the first terminal of the energy storage element outputs a positive voltage to the gate at the first time and outputs a negative voltage to the gate at a second time.

The details of one or more examples of the disclosure are set forth in the accompanying drawings and the description below. Other features, objects, and advantages of the disclosure will be apparent from the description and drawings, and from the claims.

DETAILED DESCRIPTION

The disclosure is directed to techniques for electrostatic discharge (ESD) protection that applies both a positive and negative voltage, in sequence, to an MOS power clamp during an ESD event. Applying a positive voltage to the gate of an NMOS power clamp may trigger the power clamp to switch into a parasitic bipolar mode, which may quickly shunt the electrical energy from the ESD event around other circuitry. To save area on an integrated circuit (IC) the bipolar mode may be used. However, repeatedly triggering an NMOS power clamp into bipolar mode may cause the power clamp performance to degrade. For example, the NMOS power clamp may develop an increase in leakage current. For NMOS power clamps connected between a power supply and ground, this may cause undesired power consumption. In the example of a battery powered circuit, leakages in the power clamp may prematurely drain the battery.

The techniques of this disclosure apply a negative voltage to the gate of the power clamp which is initially turned on by a short positive pulse. Both the positive and negative voltages are applied to the power clamp during the ESD event, which may be on the order of a hundred nanoseconds (ns). The positive gate voltage reduces the triggering voltage of the bipolar mode of the NMOS power clamp. The subsequent negative voltage may provide several advantages over applying the positive voltage alone. These advantages may include an improvement in leakage degradation of the power clamp after repeated ESD events. Other advantages may include a reduced holding voltage and a reduced trigger voltage for the NMOS power clamp. Reducing the holding voltage may have the further advantage of providing greater protection to the device being protected by limiting the initial ESD voltage.

The techniques of this disclosure may use the electrical energy from the ESD discharge to activate the power clamp, which has an advantage of providing ESD protection whether or not the device being protected is powered. An example of an unpowered device may be a device in a manufacturing tray or tape reel that has not yet been assembled to a circuit.

Figure 1:
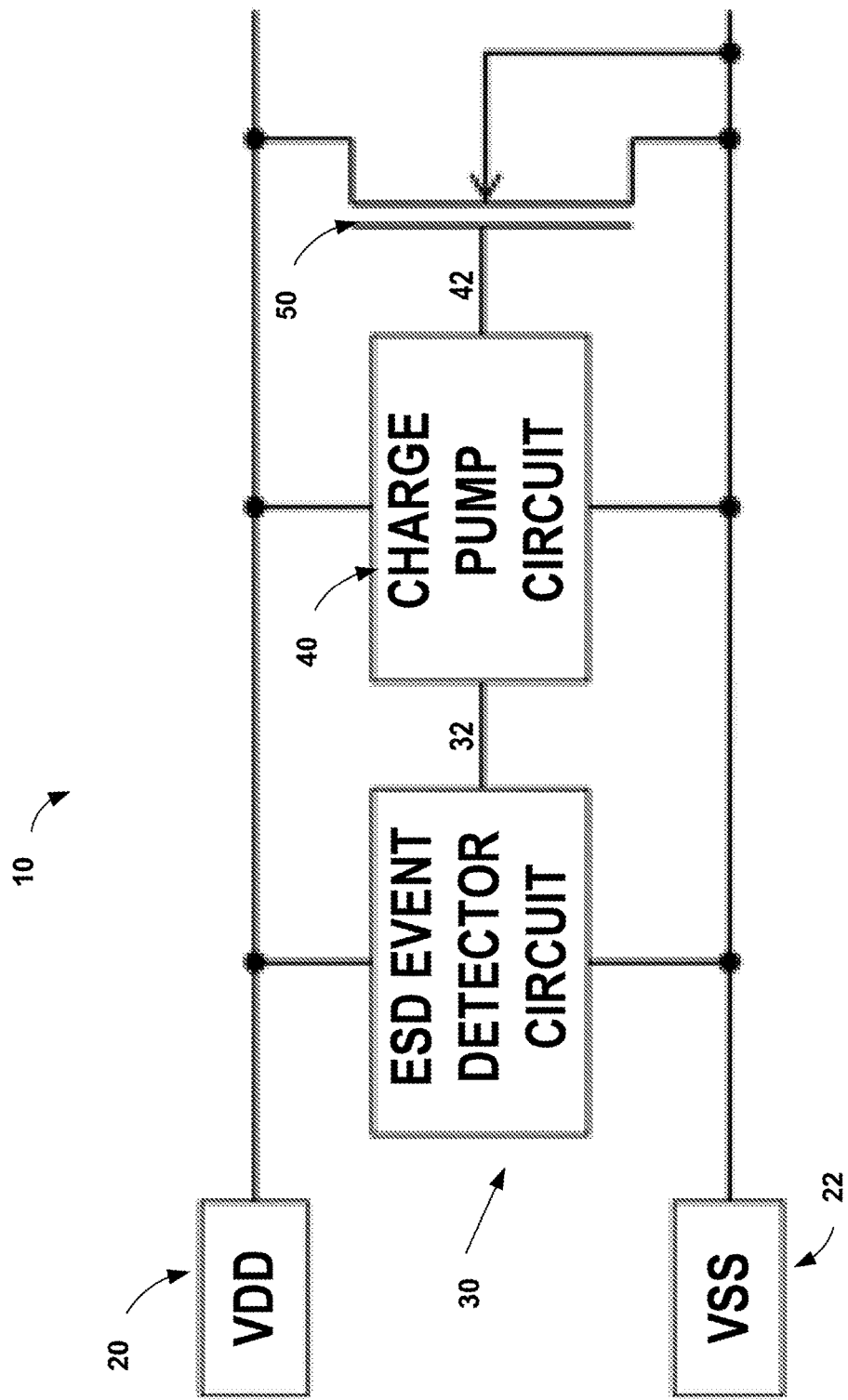
FIG. 1 is a block diagram illustrating an example electrostatic discharge (ESD) protection circuit according to one or more techniques of this disclosure.

FIG. 1 is a block diagram illustrating an example electrostatic discharge (ESD) protection circuit according to one or more techniques of this disclosure. Circuit 10 includes ESD clamping device 50 connected between supply voltage VDD 20 and ground or VSS 22. ESD event detector 30 is also connected between VDD 20 and VSS 22 and also connected to charge pump 40. Charge pump 40 also connects to the gate of ESD clamping device 50.

In the example of FIG. 1, ESD clamping device 50 is a large NMOS transistor with the conduction path connected between VDD 20 and VSS 22. The drain of ESD clamping device 50 connects to VDD 20 and the source and body connects to VSS 22. The gate of ESD clamping device 50 receives a signal from an output element 42 of charge pump 40. In some examples, ESD clamping device 50 may be referred to as an ESD power clamp In operation, ESD event detector 30 may detect a positive ESD event pulse at the circuit power supply VDD 20. In response to the ESD event at VDD 20, ESD event detector 30 is configured to trigger charge pump circuit 40 to output an initial positive voltage to the gate of ESD clamping device 50 via output element 42. ESD event detector 30 may include a timer circuit. After a predetermined amount of time, as measured by the timer circuit, ESD event detector 30 may trigger charge pump 40 to output a negative voltage to the gate of ESD clamping device 50.

Charge pump circuit 40 may include output element 42, an energy storage element and a driver circuit. The energy storage element and driver circuit are not shown in FIG. 1. The energy storage element, may include a terminal that connects to output element 42. The energy storage element may be a passive device, some of examples of which may include a capacitor, an inductor or similar devices. The driver circuit may be configured to charge the energy storage element from VDD 20. The driver circuit may be further configured to switch the energy storage element connections such charge pump 40 outputs a positive voltage followed by a negative voltage, as triggered by the timer circuit of ESD event detector 30.

In some examples, circuit 10 may be unpowered during the ESD event. In other words, circuit 10 may not be connected to another circuit, or to a power supply. Some examples of unpowered circumstances for circuit 10 may include while circuit 10 is in a manufacturing setting, such as in a dispensing reel or a parts tray or during handling while being assembled to another circuit. When circuit 10 is unpowered, ESD event detector 30, and other components of circuit 10, may use the electrical energy from the ESD event for electrical power. For example, the ESD event may activate charge pump circuit 40 and charge the energy storage element. In other words, the source of the supply voltage for the ESD protection circuit, and the source of energy for the charge pump, includes the ESD pulse. The energy from the ESD pulse may provide electrical energy for the ESD protection circuit, whether or not the IC that includes the ESD protection circuit is connected to a power supply.

In response to the positive ESD event pulse at VDD 20, ESD clamping device 50 may enter a parasitic bipolar mode of the NMOS-FET. In some examples, the initial positive pulse from charge pump 40 may trigger ESD clamping device 50 to enter the parasitic bipolar mode. The parasitic bipolar mode of ESD clamping device conducts the energy from the ESD event from VDD 20 to VSS 22, rather than through other circuitry (not shown in FIG. 1) that may be damaged by the ESD event. In this manner, circuit 10 protects sensitive circuitry from damage by the ESD event. The parasitic bipolar transistor may also be referred to as an intrinsic bipolar transistor.

As noted above, repeatedly triggering an NMOS power clamp, such as ESD clamping device 50 into the parasitic bipolar mode may cause the power clamp performance to degrade. The techniques of this disclosure that apply a negative voltage to the gate of the power clamp which may reduce the holding voltage during the ESD event as well as improve leakage degradation of the power clamp after repeated ESD events.

In other examples of ESD events, the ESD event pulse may be a negative ESD pulse. That is, a negative ESD pulse is one in which VSS 22 is at a higher potential than VDD 20. For both the positive ESD pulse and the negative ESD pulse, ESD clamping device 50 provides a conduction path to protect ESD sensitive circuitry. However, for a negative ESD pulse, the intrinsic diode of the NMOS transistor gets forward biased, becomes conducting and shorts the pulse between VSS 22 and VDD 20. For this negative polarity problems, e.g. leakage degradation, described above do not occur. For simplicity, this disclosure will focus on a positive pulse ESD event (VDD 20 higher than VSS 22). Unless otherwise noted, an ESD event of this disclosure may be assumed to be a positive ESD event pulse.

For the positive ESD event pulse, the initial positive gate signal from output element 42 triggers ESD clamping device 50 to enter the parasitic bipolar mode. In other examples, circuit 10 may be configured to apply only a negative gate signal to ESD clamping device 50. The advantage of a reduced trigger voltage described above may be desirable in the example of a negative gate signal without an initial positive gate signal. In this disclosure, a negative gate voltage means the voltage at the gate of ESD clamping device 50 is more negative than the voltage at the source of ESD clamping device 50.

Figure 2B:
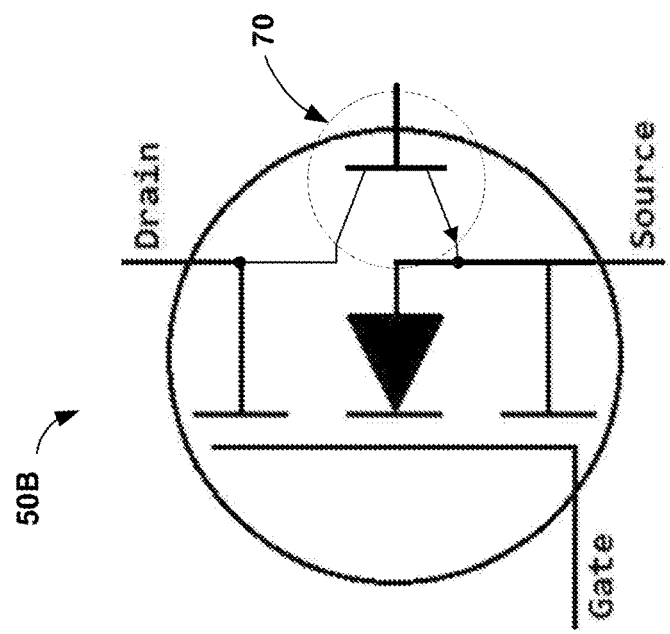
FIGS. 2A-2B are schematic diagrams illustrating an example NMOS transistor that includes a parasitic bipolar junction transistor (BJT).
Figure 2A:
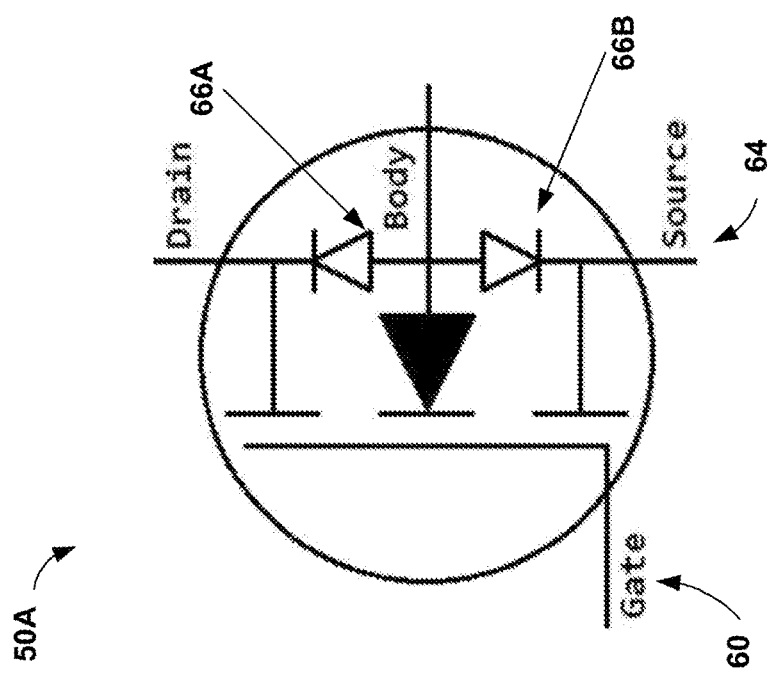

FIGS. 2A-2B are schematic diagrams illustrating an example NMOS transistor that includes a parasitic bipolar junction transistor (BJT). ESD clamping device 50A of FIG. 2 may include gate 60, drain 62 and source 64. The construction of an NMOS transistor includes two pn junctions which may result in diodes 66A and 66B in the body of ESD clamping device 50A. The cathode of diode 66A connects to drain 62, the cathode of 66B connects to the source. The anode of 66A connects to the anode of 66B. Two pn junctions connected in the configuration as shown in FIG. 2, may result in a parasitic bipolar transistor (BJT) 70 as shown in FIG. 2B. Therefore, an ESD clamping device, 50A and 50B, comprising a parasitic BJT 70 may enter a bipolar mode, as described above in relation to FIG. 1.

Figure 3A:
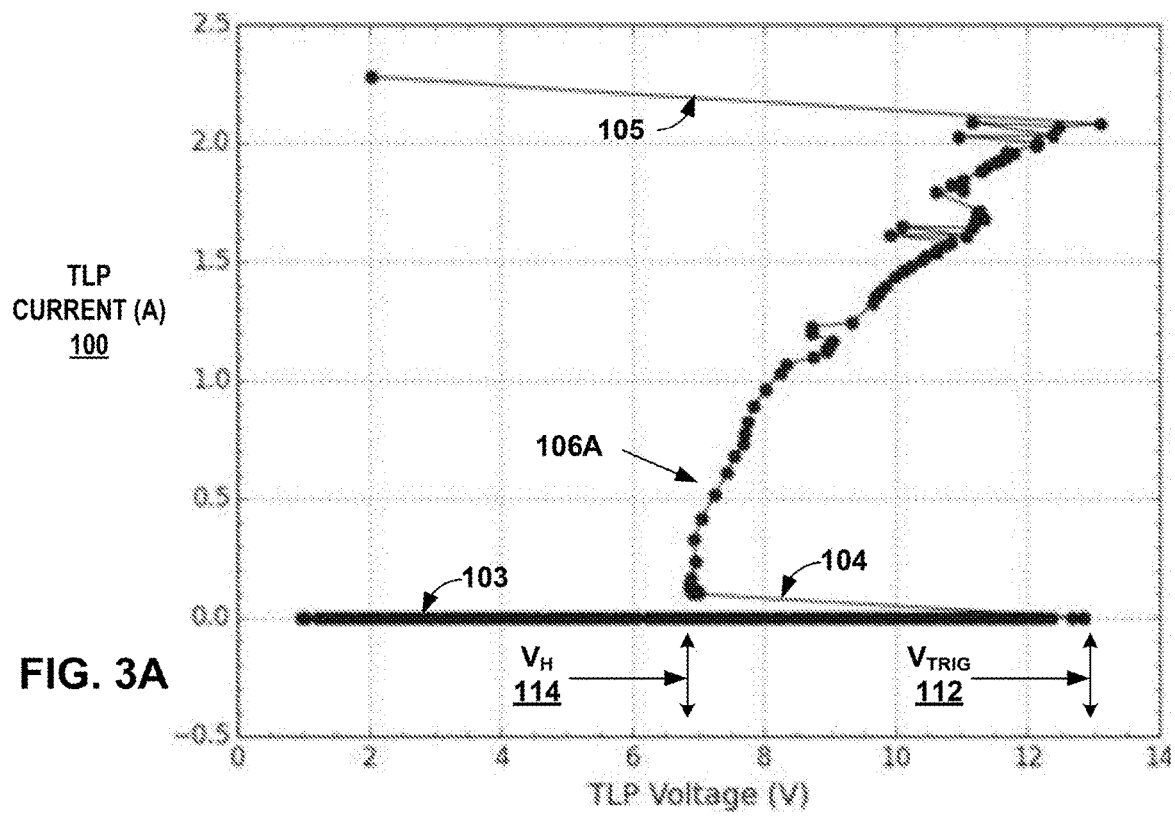
FIG. 3A is a graph illustrating the behavior of a standalone HV-NMOS with the source and gate grounded and applying transmission line pulsing (TLP) pulses to the drain.

FIG. 3A is a graph illustrating the behavior of a standalone HV-NMOS transistor with the source and gate grounded and applying transmission line pulses (TLP) to the drain. A TLP is a method to characterize the robustness of a device with respect to an ESD event. A TLP test may record failure level as well as device behavior by delivering a series of short pulses of increasing voltage amplitude over time, followed by a DC leakage test after each pulse. In some examples a TLP may be generated by charging a transmission line, called a charge line, with power supply. The charge line has a length proportional to the desired test pulse width. Once charged, the charge line may be connected to the device under test (DUT) and the voltage at the DUT, as well as the current through the DUT may be measured. TLP testing may be done for example at the IC package level or wafer level.

In the example of FIG. 3A, the voltage on the gate of the HV-NMOS transistor, which may be used as an ESD clamping device, is zero volts. The TLP test starts with pulses at a lower voltage level that increase over time. In the region indicated by 103, the ESD clamping device remains high impedance/high ohmic.

The region indicated by 104 depicts the snapback threshold, or trigger voltage $V_{TRIG}$ 112, where the ESD clamping device begins to conduct. The TLP at this level is a strong voltage pulse applied to the drain of the NMOS ESD clamping device. In some examples the pulse may be larger than the NMOS can carry under normal conditions. As a result of the voltage pulse, which simulates an ESD pulse, the parasitic currents may increase and at $V_{TRIG}$ 112 the parasitic bipolar begins to conduct and may carry most of the current from the voltage pulse. The voltage level of $V_{TRIG}$ 112 may depend on the conditions the NMOS transistor is in. For the example of FIG. 3A, the source and gate of the ESD clamping device are connected to ground and the triggering happens at approximately 13V. The tests on the ESD clamping device depict a device that is built in such a way that it can carry the large current, at least for the short time of an ESD pulse. In other examples, a large voltage pulse may destroy the transistor.

Through the region 104, the drain source voltage decreases to approximately 7V, in the example of FIG. 3.

The voltage level at which the parasitic bipolar transistor shuts off is the holding voltage $V_H$ 114. Subsequent pulses of increasing voltage, in the region indicated by 106A depict the ON-resistance ($R_{DS}$) of the ESD clamping device. As the voltage of the TLP increases (along the horizontal axis), the TLP current 100 increases. The ESD clamping device remains in the ON-resistance region until failure, indicated by 105.

Figure 3B:
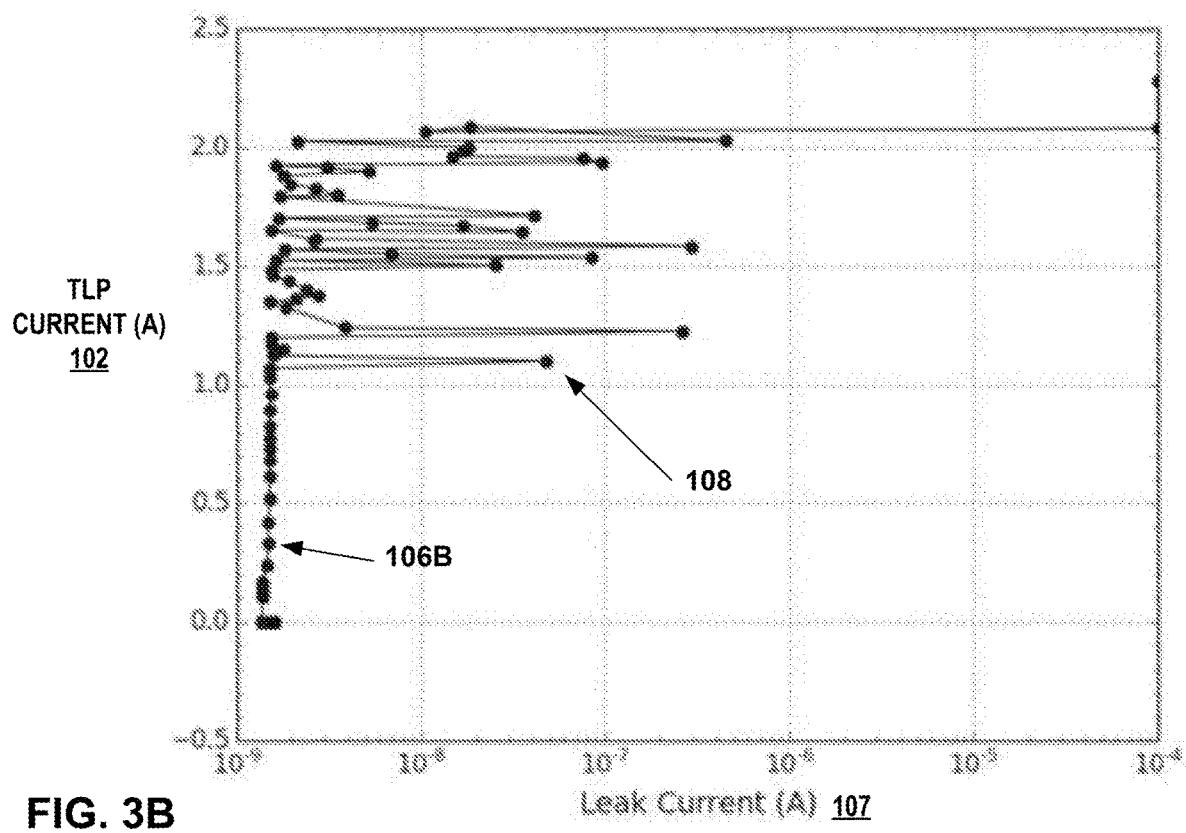
FIG. 3B is a graph illustrating the leakage performance of the standalone HV-NMOS after a series of TLP to the drain with the gate held at zero volts relative to the source.

FIG. 3B is a graph illustrating the leakage performance of the standalone HV-NMOS after a series of TLP to the drain with the gate held at zero volts relative to the source. As described above in relation to FIG. 3A, after each TLP of increasing voltage amplitude the leakage current 107 is measured with a drain voltage of 5.5V. The TLP voltage increases in the ON-resistance region, indicated by 106B with leakage currents in the nanoamp range. After repeated TLPs with zero volts on the gate, the ESD clamping device begins to have leakage currents of increasing magnitude, as indicated by 108.

Figure 4A:
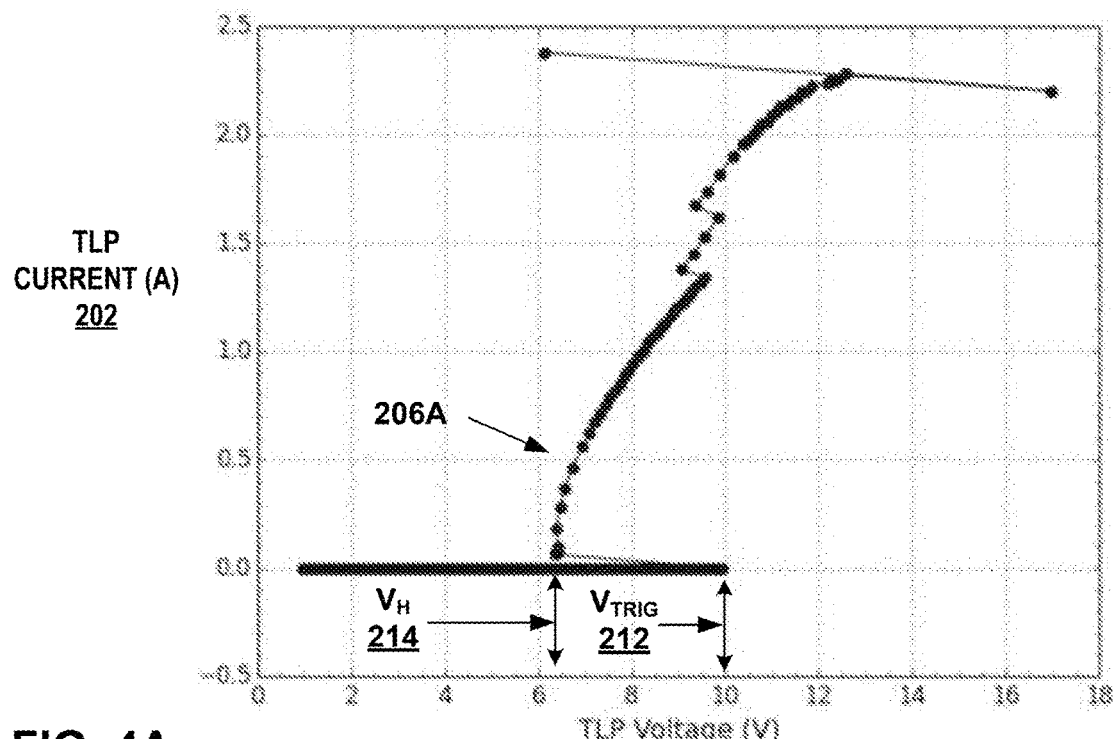
FIG. 4A is a graph illustrating the behavior of a standalone MV-NMOS with the gate held at −5 V relative to the source and applying TLP to the drain.

FIG. 4A is a graph illustrating the behavior of a standalone MV-NMOS with the gate held at −5 V relative to the source and applying TLP to the drain. In comparison to the example of FIG. 3A, applying a negative gate voltage to the ESD clamping device results in a decreased trigger voltage $V_{TRIG}$ 212 to approximately 10 V. The holding voltage $V_H$ 214, reduced by approximately 0.5V to 6.5V. As described above, reducing the holding voltage may have the advantage of providing greater protection by limiting the initial ESD voltage. In other words, by reducing the initial ESD voltage with a negative gate voltage, the ESD clamping device may protect the ESD sensitive circuitry elsewhere in the circuit, as described above in relation to FIG. 1. FIG. 4A depicts subsequent pulses greater than $V_H$ 214 increasing in the ON-resistance region 206A until failure.

Figure 4B:
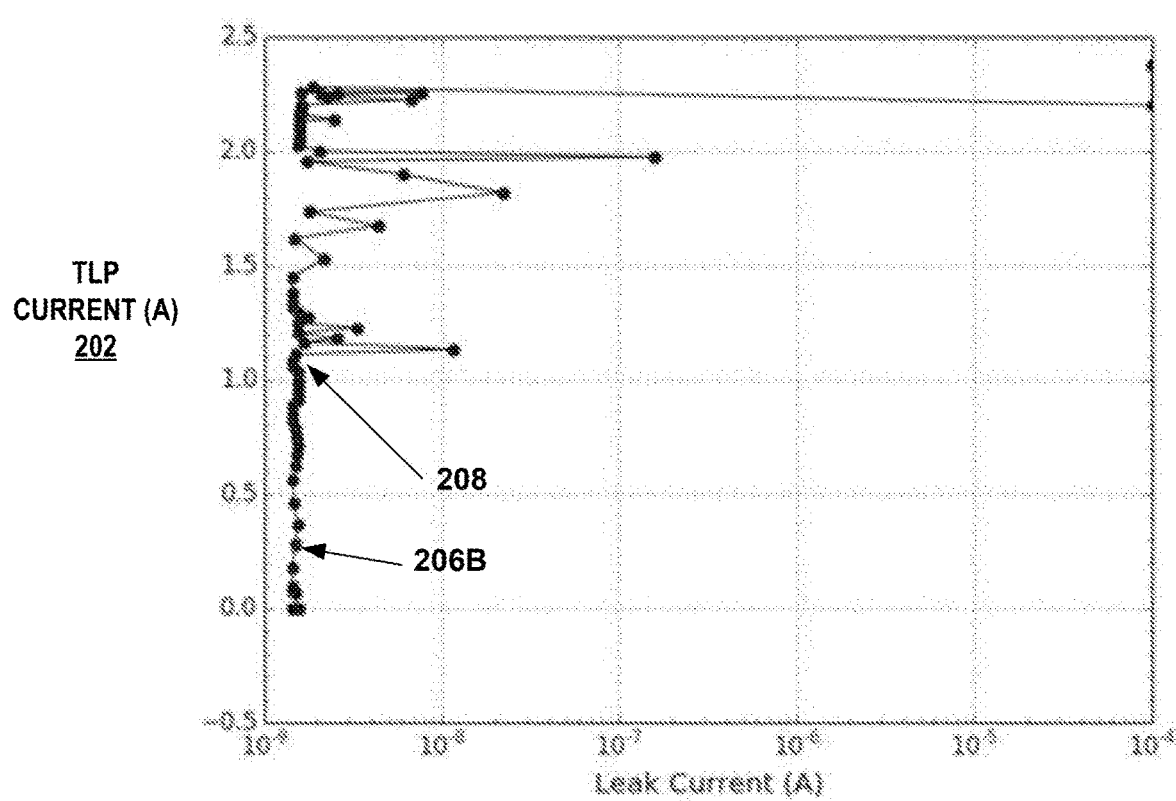
FIG. 4B is a graph illustrating the leakage performance of the standalone MV-NMOS after a series of TLP to the drain with the gate held at −5 V relative to the source.

FIG. 4B is a graph illustrating the leakage performance of the standalone MV-NMOS after a series of TLP to the drain with the gate held at −5 V relative to the source. In comparison to the example of FIG. 4B, with zero volts on the gate of the ESD clamping device, the leakage currents with a negative voltage on the gate are reduced by a factor of approximately 100.

Figure 5A:
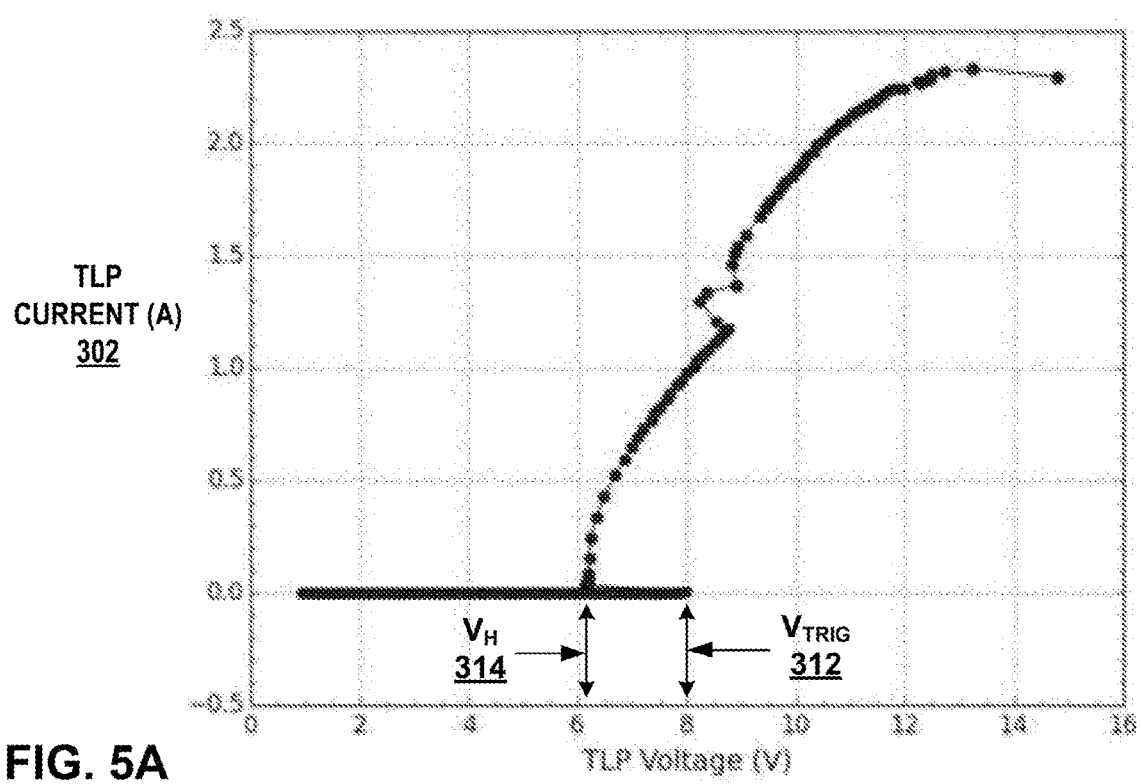
FIG. 5A is a graph illustrating the behavior of a standalone MV-NMOS with the gate held at −10 V relative to the source and applying TLP to the drain.

FIG. 5A is a graph illustrating the behavior of a standalone MV-NMOS with the gate held at −10 V relative to the source and applying TLP to the drain. Comparing the example of FIG. 5A to FIGS. 3A and 4A shows a reduction in the trigger voltage $V_{TRIG}$ 312 to approximately 8 V. The holding voltage $V_H$ 314, reduced by approximately 0.2V to 6.3V. Therefore, the additional negative voltage on the gate of the ESD clamping device has a small effect on $V_H$ 314.

Figure 5B:
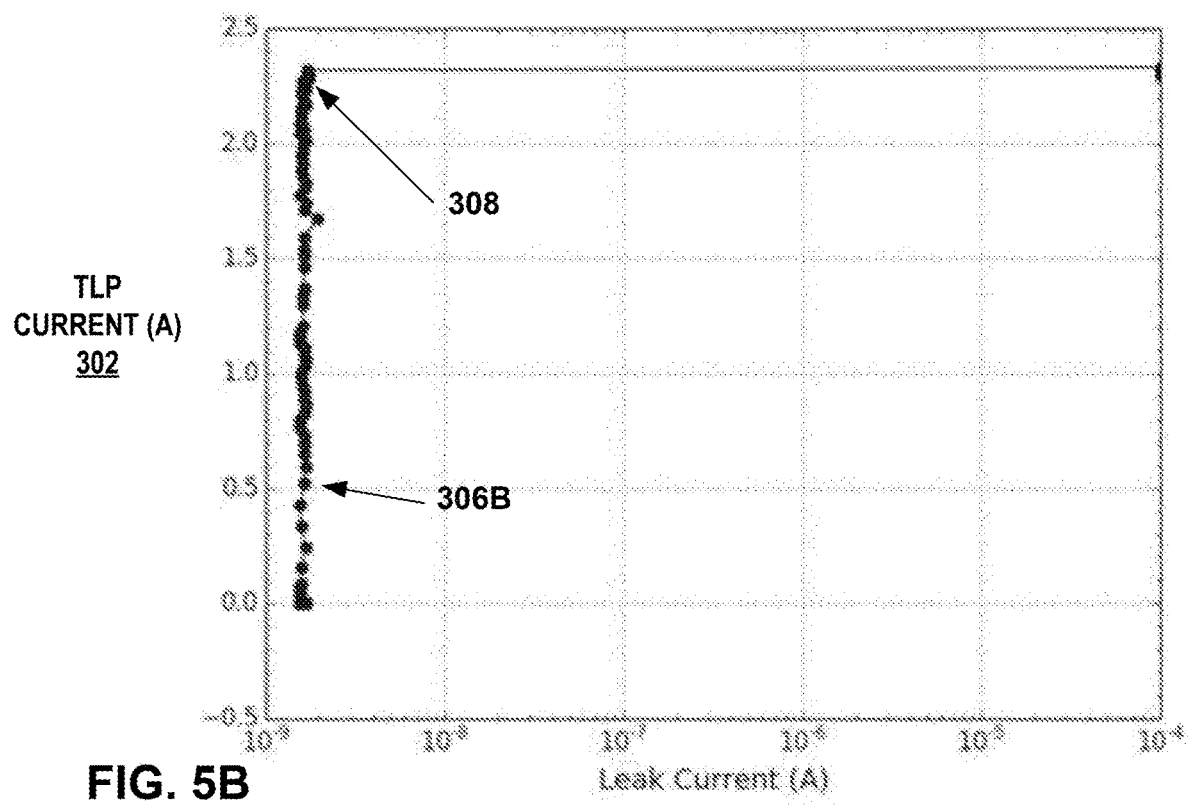
FIG. 5B is a graph illustrating the leakage performance of the standalone MV-NMOS after a series of TLP to the drain with the gate held at −10 V relative to the source.

FIG. 5B is a graph illustrating the leakage performance of the standalone MV-NMOS after a series of TLP to the drain with the gate held at −10 V relative to the source. The additional negative voltage on the gate of the ESD clamping device shows a significant improvement in leakage current all the way up to the failure point. The leakage current remains in the approximate range of 1.5 nA throughout the ON-resistance region 306B. The examples of FIGS. 3A-5B show a clear advantage of a negative gate voltage in the performance of the ESD clamping device, and especially a reduction in leakage current for repeated ESD pulses.

Figure 6:
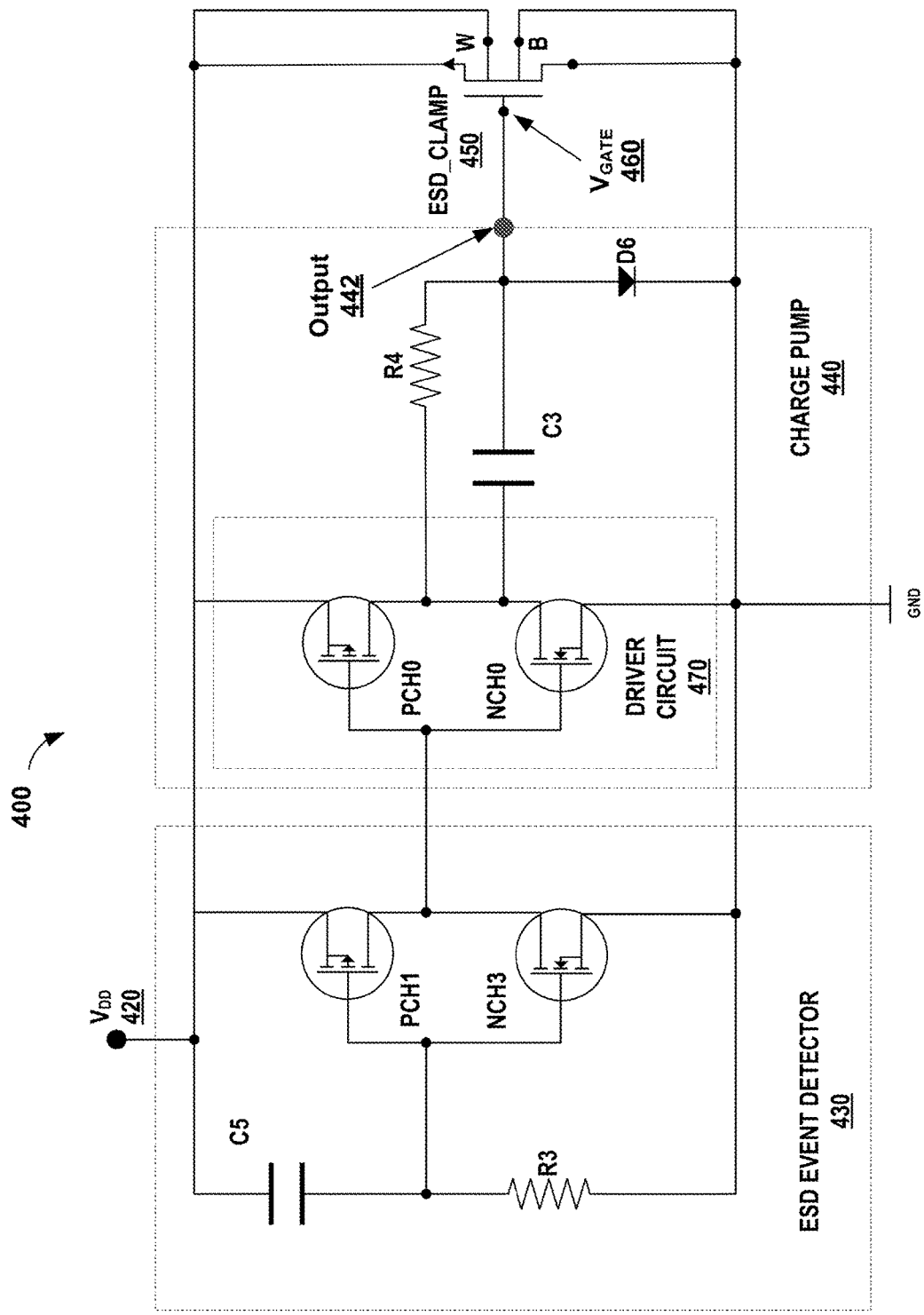
FIG. 6 is a schematic diagram illustrating an example ESD protection circuit with a single stage charge pump circuit according to one or more techniques of this disclosure.

FIG. 6 is a schematic diagram illustrating an example ESD protection circuit with a single stage charge pump circuit according to one or more techniques of this disclosure. The blocks of the example of FIG. 6 correspond to similar blocks described above in relation to FIG. 1. Example ESD protection circuit 400 of FIG. 6 includes ESD event detector 430, charge pump 440 and ESD clamp 450.

ESD event detector includes PMOS transistor PCH1 with the drain connected to VDD 420 and the source connected to the drain of NMOS transistor NCH3 as well as to the gates of PCH0 and NCH0. The source of NCH3 connects to ground, which in some examples may also be VSS. Capacitor C5 connects VDD 420 to the gates of PCH1 and NCH3, while resistor R3 connects the gates of PCH1 and NCH3 to ground.

Charge pump 440 includes driver circuit 470, a storage device, capacitor C3, resistor R4 and diode D6. In some examples, diode D6 may any semi-conductor element, which may include a transistor. Driver circuit 470 includes PMOS transistor PCH0, which has its drain connected to VDD 420 and source connected to the drain of NMOS transistor NCH0. The source of NCH0 connects to ground. The gates of NCH0 and PCH0 receive a signal from the ESD event detector 430.

Resistor R4, in parallel with capacitor C3, connects the node comprising the drain of NCH0 and drain of PCH0 to the output element 442 of charge pump 440. Output element 442 connects to ground through diode D6.

Output element 442 connects to the gate of ESD clamp 450, which is an NMOS transistor with a parasitic bipolar transistor, similar to that depicted in FIG. 2. The voltage at the gate of ESD clamp 450 is $V_{GATE}$ 460. The drain of ESD clamp 450 connects to VDD 420 and the source connects to ground. In the example of FIG. 6, a bulk terminal of ESD clamp 450 also connects to ground and a well terminal connects to VDD 420. ESD clamp 450 may also be referred to as ESD clamping device 450.

In operation, circuit 400 may not be connected to a power source, as described above in relation to FIG. 1 above, such as in a manufacturing setting. An ESD event, which may also be referred to as an ESD pulse, may raise VDD 420 to be positive relative to ground. The example of circuit 400 includes a rise time detection scheme using the RC network of C5 and R3. In other examples, ESD event detector 430 may include a voltage detection scheme, such as a diode chain. Detecting the ESD pulse may comprise selecting the values for C5, R3 and the transistors PCH1 and NCH3 such that when a rise time of a voltage pulse on VDD 420 satisfies a rise time threshold, the ESD protection circuit triggers charge pump circuit 440. In other words, when a fast rise time of a pulse is shorter than the rise time threshold, the ESD protection triggers charge pump circuit 440. The RC network of C5 and R3 also act as a timer element for ESD event detector 430. Transistors PCH1 and NCH3 act as an inverter for the RC network of C5 and R3 to output a trigger signal to charge pump circuit 440.

Driver circuit 470 of charge pump 440 connects one side of a storage device, which is capacitor C3 in the example of circuit 400 to either VDD 420 or ground (VSS). Current can only flow in one direction to charge C3 while the C3 is connected to VDD because a semiconductor element, diode D6, is placed in series with C3. Hence when an ESD event is detected capacitor C3 charges and the positive voltage of one diode voltage drop (of D6) is applied to the gate of the large NMOS, ESD claim 450 via output element 442, to bring ESD clamp 450 into the bipolar mode.

As soon as the time constant of the RC element, comprising C5 and R3 is over, ESD event detector 430 sends a signal to driver circuit 470 via the inverter comprising PCH1 and NCH3 to turn on transistor NCH0. Turning on NCH0 connects one terminal of capacitor C3 to VSS, which causes a negative voltage to be applied to the gate via output element 442. Resistor R4 is connected in parallel to the storage device, C3 of charge pump 440 to prevent output element 442, and therefore the voltage $V_{GATE}$ 460 from freely floating. The RC time constant of capacitor C3 and parallel resistor R4 in the charge pump are selected to be long enough to let an ESD pulse pass. In some examples the RC time constant may be in the ranges of approximately ten nanoseconds (ns) to one microsecond (µs).

After the completion of the ESD event, and no triggering signal from ESD event detector 430, charge pump 440 keeps the gate potential, $V_{GATE}$ 460, at VSS or lower. Charge pump 440 is useful to transform a small part of the ESD pulse into a negative potential on the gate of ESD claim 450 for unpowered devices because no negative voltage is available. It is desirable to have a high negative voltage quickly applied to the gate to realize the advantages of the techniques of this disclosure.

Figure 7:
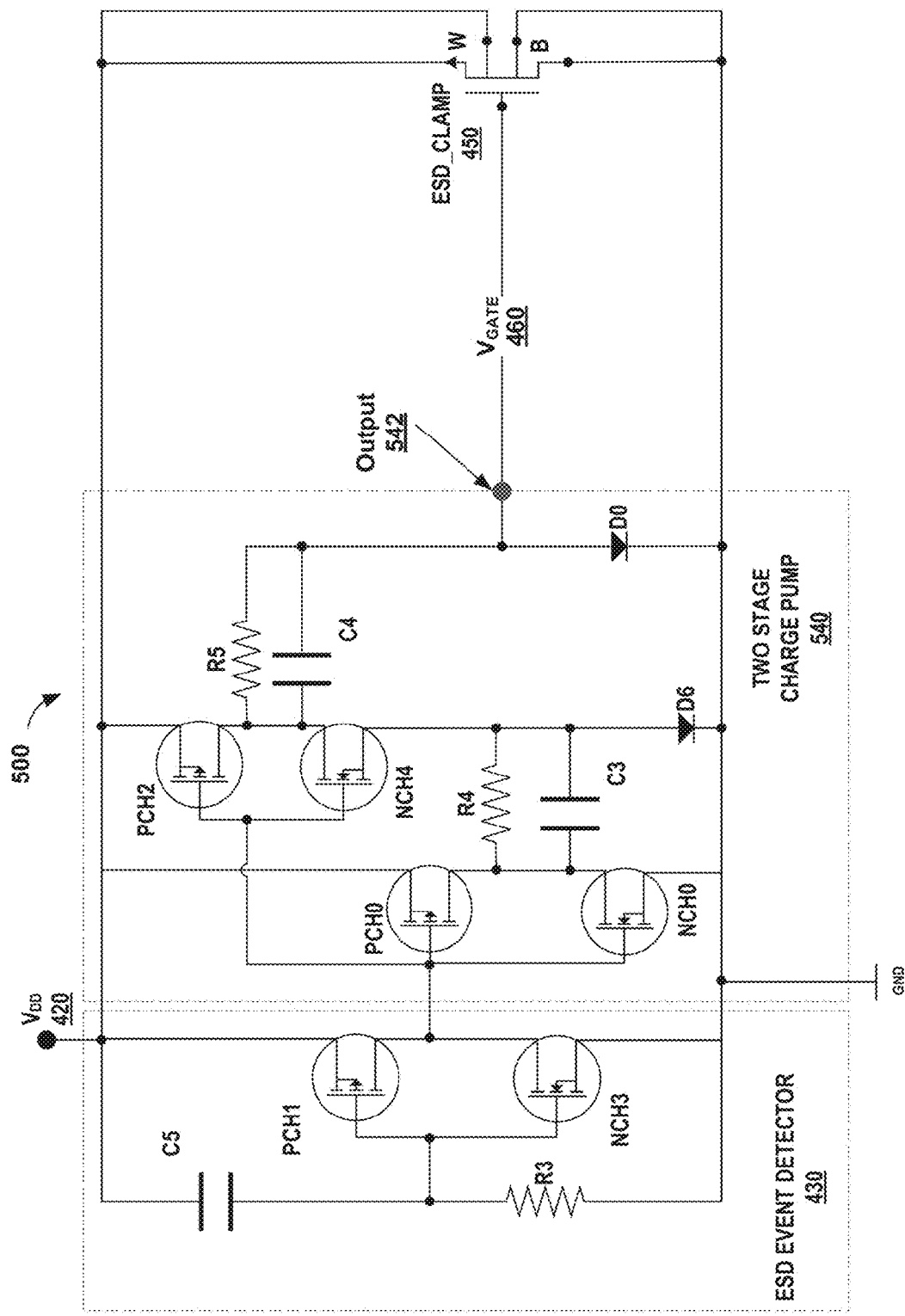
FIG. 7 is a schematic diagram illustrating an example ESD protection circuit with a two-stage charge pump circuit according to one or more techniques of this disclosure.

FIG. 7 is a schematic diagram illustrating an example ESD protection circuit with a two-stage charge pump circuit according to one or more techniques of this disclosure. A two-stage charge pump circuit may be useful to increase the negative gate voltage value $V_{GATE}$ 460.

The circuit of FIG. 7 is the same as that depicted by FIG. 6, with the addition of a second stage in charge pump 540. The second stage includes a similar driver circuit, parallel RC combination and diode as depicted in single stage charge pump circuit 440 of FIG. 6.

In the second stage the gates of PMOS transistor PCH2 and NMOS transistor NCH4 connect to the output of the inverter of ESD event detector 430, as well as the gates of PCH0 and NCH0. The source of NCH4 connects to the anode of diode D6, as well as one terminal of resistor R4 and capacitor C3 from the first stage. The drain of PCH2 connects to VDD 420. The node comprising the source of PCH2 and the drain of NCH4 connect to the anode of diode D0 through the parallel combination of resistor R5 and capacitor C4. Capacitor C4 acts as the storage element of the second stage. As noted above, in other examples, charge pump circuit 540 may be reconfigured to use other types of storage elements, such as an inductor. The cathode of D0 connects to ground. Output element 542 connects to the anode of D0 and to the gate of ESD clamp 450.

In operation, circuit 500 operates similar to circuit 400 in that a positive ESD pulse on VDD 420 triggers ESD event detector 430 to output a trigger signal to charge pump 540, when the rise time detection features of ESD event detector 430 detect a rise time above a threshold. The first stage storage element, capacitor C3 connects to output element 542 through transistor NCH4 and the second stage storage element, capacitor C4 to generate a more negative voltage than by a single stage charge pump. As described above in relation to FIGS. 3A-5B, a more negative voltage may have advantages such as improve leakage degradation of the power clamp after repeated ESD events.

Figure 8:
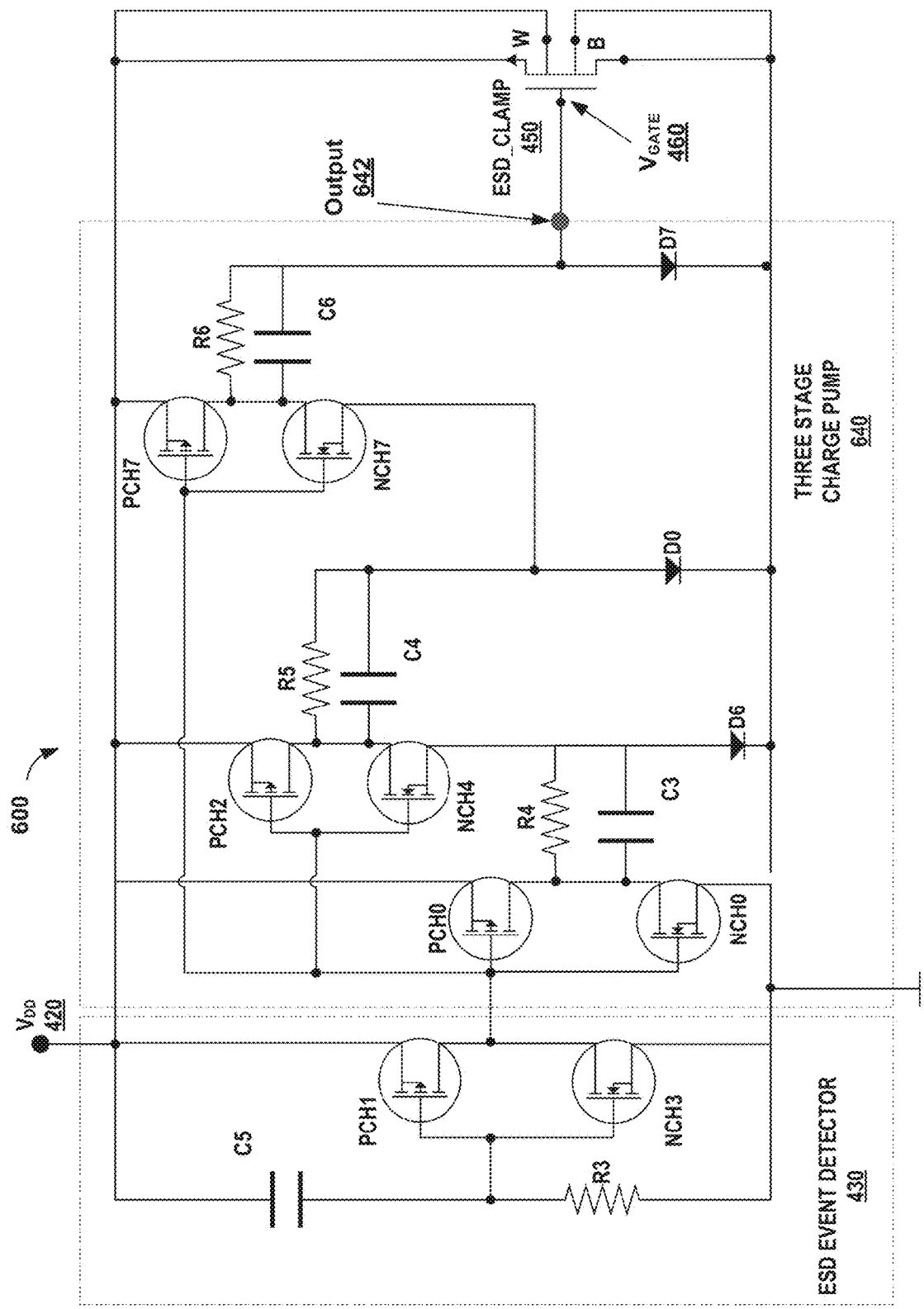
FIG. 8 is a schematic diagram illustrating an example ESD protection circuit with a three-stage charge pump circuit according to one or more techniques of this disclosure.

FIG. 8 is a schematic diagram illustrating an example ESD protection circuit with a three-stage charge pump circuit according to one or more techniques of this disclosure. The third stage includes a similar driver circuit, parallel RC combination and diode as depicted in single stage charge pump circuit 440 of FIG. 6 and two stage charge pump circuit 540 of FIG. 7.

In the third stage the gates of PMOS transistor PCH7 and NMOS transistor NCH7 connect to the output of the inverter of ESD event detector 430, as well as the gates of the first stage transistors PCH0 and NCH0 and second stage transistors PCH2 and NCH4. The source of NCH7 connects to the anode of diode D0, as well as one terminal of resistor R5 and capacitor C4 from the second stage. The drain of PCH7 connects to VDD 420. The node comprising the source of PCH7 and the drain of NCH7 connect to the anode of diode D7 through the parallel combination of resistor R6 and capacitor C6. Capacitor C6 acts as the storage element of the third stage. The first storage element, capacitor C3 connects to output element 642 through transistor NCH4 and the second stage storage element, capacitor C4. The first and second stage storage elements connect to output element 642 through NCH7 and capacitor C6 to generate a more negative voltage than by a two-stage charge pump. Output element 642 connects to the anode of D7 and to the gate of ESD clamp 450. The cathode of D7 connects to ground. In operation the three stage ESD protection circuit 600 operates in a similar manner as described above for circuits 400 and 500.

In some examples, the dimensions of the transistors may be different for the different stages. The dimensions may be adjusted as needed to deliver the desired negative voltage to the output element in response to an ESD event. In one example the lengths of the PMOS transistors, PCH0, PCH2 and PCH7 may all be approximately the same. The widths of the PMOS transistors may be different for the different stages, which results in a different length-width (L/W) ratio for the stages. As one example, the width for the second and third stage transistors PCH2 and PCH7 may be selected to be approximately 40% of the width for the first stage transistor.

Similarly, the dimensions for the of the PMOS transistors, NCH0, NCH4 and NCH7 may be different. In one example the lengths of the NMOS transistors may all be approximately the same. The width for the third stage NMOS transistor NCH7 may be selected to be approximately 10% of the width for the first stage NMOS transistor NCH0. The width for the second stage NMOS transistor NCH7 may be selected to be approximately half of the width for the first stage NMOS transistor NCH0. The L/W ratios for the transistors may also depend on the values selected for other components, such as resistors, capacitors, the diode voltage drop of the selected diodes and the characteristics of ESD clamp 450.

Figure 9:
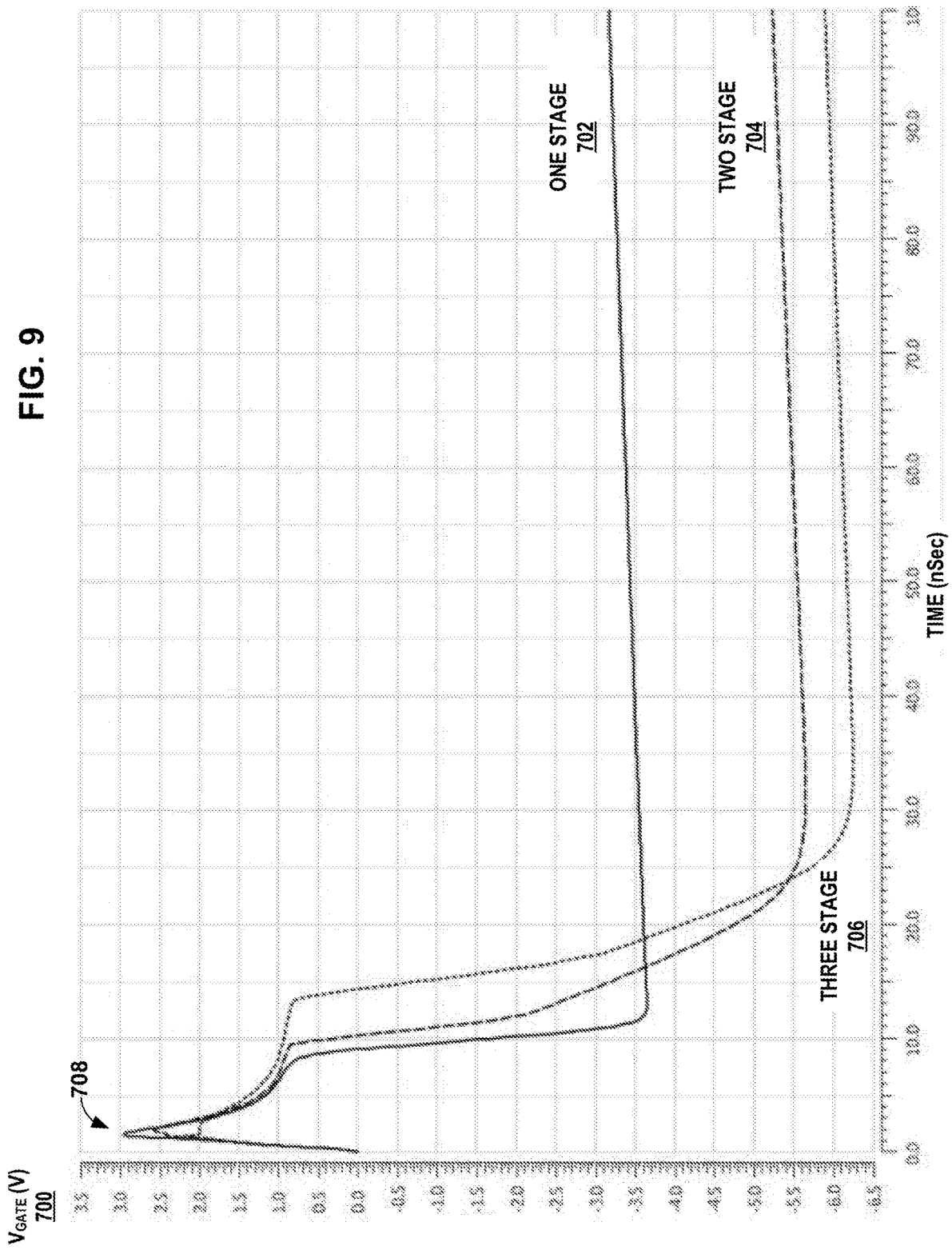
FIG. 9 is a time graph illustrating the gate voltage over time for example ESD protection circuits according to one or more techniques of this disclosure.

FIG. 9. is a time graph illustrating the gate voltage over time for example ESD protection circuits, according to one or more techniques of this disclosure. FIG. 9 illustrates the output voltage to the gate of the ESD clamping device, $V_{GATE}$ 700 over time for a single stage, two-stage and three-stage ESD protection circuit during a two kilo-volt (kV) HBM pulse.

As described above in relation to FIGS. 6-8, the ESD protection circuit examples of this disclosure output a large negative voltage to the gate of the ESD clamping device preceded by a short positive pulse. The techniques of this disclosure may cause the ESD clamping device to enter a parasitic bipolar mode to conduct the current from an ESD event from VDD to VSS and protect other ESD sensitive circuitry.

At time zero, in the example of FIG. 9, an ESD protection circuit of this disclosure receives an ESD event at VDD. As indicated by 708, the output from the ESD event detection circuit causes the charge pump circuit to output a positive pulse, which rises for approximately 2 ns. The ESD event detection circuit timer, which is an RC combination in the examples of FIGS. 6-8, causes the charge pump circuit to connect the now charged storage device (s) to ground, which applies a negative voltage to the gate of the ESD clamping device beginning at approximately 10.0 ns. As depicted by the example of FIG. 9, the two-stage charge pump circuit 704 may deliver a more negative voltage than the one stage circuit 702. The three-stage circuit 706 may deliver a more negative voltage than the two-stage circuit 704. Similar ESD protection circuits may include more than three stages as desired for more negative voltage output.

Figure 10:
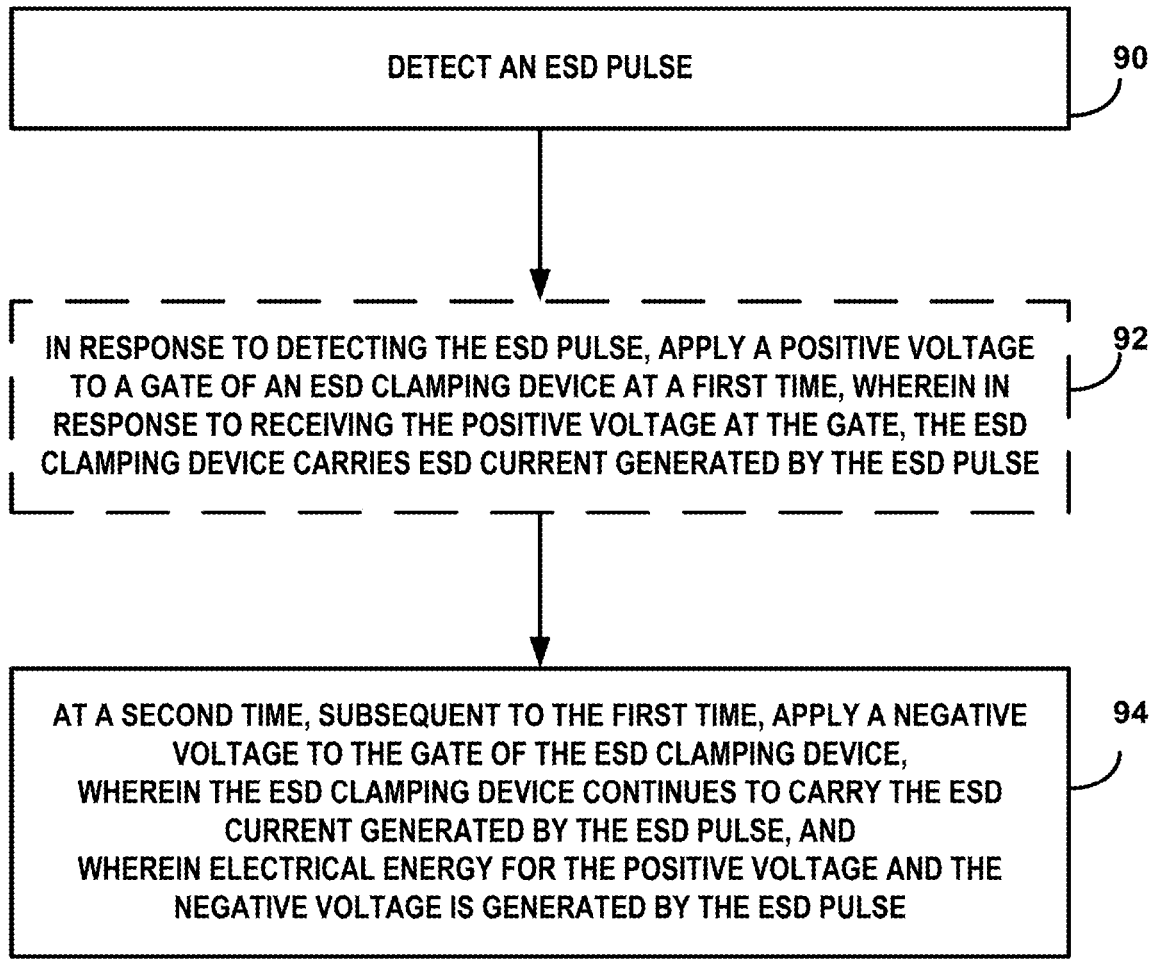
FIG. 10 is a flow chart illustrating the operation of an example ESD protection circuit according to one or more techniques of this disclosure.

FIG. 10 is a flow chart illustrating the operation of an example ESD protection circuit according to one or more techniques of this disclosure. The steps of FIG. 10 will be described in terms of FIGS. 1 and 6, unless otherwise noted.

An ESD protection circuit may detect an ESD event, which may also be called an ESD pulse, at the power supply terminal (90). ESD event detector 30 may determine the pulse is an ESD pulse if the pulse rise time exceeds a threshold, or if the voltage exceeds a threshold voltage, or by some other detection mechanism. The ESD protection circuit may use the energy from the ESD pulse to power the portions of the ESD protection circuit.

In response to detecting the ESD pulse, ESD protection circuit 10 may apply a positive voltage to a gate of ESD clamping device 50. The positive pulse may help ESD clamping device 50 enter a parasitic bipolar mode. In response to the ESD pulse on VDD 20, and receiving the positive voltage at output element 42, connected to the gate of ESD clamping device 50 may carry ESD current generated by the ESD pulse through its conduction path to VSS 22 (92).

At a second time, subsequent to applying the positive pulse, ESD protection circuit 10 may apply, a negative voltage to output element 42 connected to the gate of ESD clamping device 50 (94). In the example of FIG. 6, charge pump circuit 440 receives a second signal, subsequent to the trigger signal, from the inverter of ESD event detector 430. In other words, when the RC network of R3 and C5 finishes charging, transistor NCH0 connects the now charged storage element, capacitor C3 to VSS. The voltage across C3 now causes the voltage $V_{GATE}$ 460 and output element 442 to be negative. ESD clamping device 450 continues to carry the ESD current generated by the ESD pulse. To deliver a more negative voltage to the output element, a multiple stage charge pump may be used.

As described above, the subsequent negative voltage at the gate of the ESD clamping device may provide several advantages over applying the positive voltage alone. These advantages may include an improvement in leakage degradation of the power clamp after repeated ESD events. Other advantages may include a reduced holding voltage and a reduced trigger voltage for the NMOS power clamp. Reducing the holding voltage may have the further advantage of providing greater protection to the device being protected by limiting the initial ESD voltage.

Example 1. A method of electrostatic discharge (ESD) protection, the method comprising: detecting, by an ESD protection circuit, an ESD pulse. In response to detecting the ESD pulse, applying, by the ESD protection circuit, a negative voltage to the gate of the ESD clamping device, wherein the ESD clamping device carries the ESD current generated by the ESD pulse, and wherein electrical energy for the positive voltage and the negative voltage is generated by the ESD pulse.

Example 2. The method of example 1, wherein in response to receiving the positive voltage at the gate the ESD clamping circuit enters a parasitic bipolar mode.

Example 3. The method of the combination of examples 1 and 2, wherein detecting the ESD pulse comprises determining by the ESD protection circuit, that a rise time satisfies a rise time threshold.

Example 4. The method of any combination of examples 1-3, wherein the ESD detection circuit determines the first time and the second time based on a resistor-capacitor (RC) time constant.

Example 5. The method of any combination of examples 1-4, wherein the negative voltage to the gate of the ESD clamping device protects the ESD clamping device from leakage.

Example 6. A charge pump circuit comprising an output element, an energy storage element, wherein a first terminal of the energy storage element connects to the output element, and a driver circuit configured to: charge the energy storage element from a supply voltage at a first time, switch the energy storage element connections such that the first terminal of the energy storage element outputs a positive voltage at the first time and outputs a negative voltage at a second time.

Example 7. The charge pump circuit of example 6, wherein source of the supply voltage comprises an electrostatic discharge (ESD) pulse.

Example 8. The charge pump circuit of any of examples 6-8 or any combination thereof, wherein the energy storage element is a capacitor.

Example 9. The charge pump circuit of any combination of examples 6-8, wherein the driver circuit comprises: a first switch, wherein the first switch connects the supply voltage to a second terminal of the energy storage element, and a second switch, wherein the second switch connects the second terminal of the energy storage element to a ground.

Example 10. The charge pump circuit of any combination of examples 6-9, further comprising a semi-conductor element configured to allow charging current for the energy storage element to flow in only one direction and wherein a first terminal of the semi-conductor element connects to the first terminal of the energy storage element.

Example 11. The charge pump circuit of any combination of examples 6-10, wherein the semi-conductor element is a diode.

Example 12. An electrostatic discharge (ESD) protection circuit, the circuit comprising; an ESD clamping device comprising a gate and a conduction path, wherein the conduction path connects a circuit power supply to a circuit ground; and a charge pump circuit comprising: an output element, wherein the output element of the charge pump circuit connects to the gate of the ESD power clamp, an energy storage element, wherein a first terminal of the energy storage element connects to the output element, and a driver circuit configured to: charge the energy storage element from a supply voltage at a first time; and switch the energy storage element connections such that the first terminal of the energy storage element outputs a positive voltage to the gate at the first time and outputs a negative voltage to the gate at a second time.

Example 13. The circuit of example 12, wherein further comprising an ESD event detector, which includes a timer circuit, wherein the ESD event detector is configured to: in response to an ESD event at the circuit power supply, trigger the charge pump circuit to output the positive voltage at the first time and triggers the charge pump to output the negative voltage at the second time, wherein the second time is subsequent to the first time and wherein the first time and the second time is based on the timer circuit.

Example 14. The circuit of any combination of examples 12-13, wherein the ESD clamping device is an n-type metal oxide semiconductor (NMOS) field effect transistor (FET).

Example 15. The circuit of any combination of examples 12-14, wherein the positive voltage at the first time causes the NMOS-FET to enter a parasitic bipolar mode.

Example 16. The circuit of any combination of examples 12-15, wherein the ESD event comprises electrical energy and wherein the ESD protection circuit uses the electrical energy to activate the charge pump circuit and charge the energy storage element.

Example 17. The circuit of any combination of examples 12-16, wherein the positive voltage to the gate at a first time is a trigger voltage, wherein the ESD clamping device, in response to the trigger voltage, enters a parasitic bipolar mode, and the negative voltage is more negative than a voltage at a source terminal of the ESD clamping device at the second time.

Example 18. The circuit of any combination of examples 12-17, wherein the output element, the energy storage element and driver circuit of the charge pump circuit comprises a first stage of the charge pump circuit; the charge pump circuit further comprising a second stage, including: a second energy storage element, a second driver circuit, and a second output element, wherein a first terminal of the second energy storage element connects to the gate of the ESD clamping device.

Example 19. The circuit of any combination of examples 12-18, wherein further comprising a resistor connected between the driver circuit and the output element, in parallel to the second energy storage element, wherein the resistor is configured to prevent a gate voltage of the ESD clamping device from freely floating.

Example 20. The circuit of any combination of examples 12-19, wherein the energy storage element is a capacitor.

Various examples of the disclosure have been described. These and other examples are within the scope of the following claims.

The invention claimed is:

1. A method of electrostatic discharge (ESD) protection, the method comprising:
   detecting, by an ESD protection circuit, an ESD pulse;
   in response to detecting the ESD pulse, applying, by the ESD protection circuit, a negative voltage to a gate of the ESD clamping device at a first time, wherein the ESD clamping device enters a parasitic bipolar mode and carries the ESD current generated by the ESD pulse,
   wherein the negative voltage to the gate has a polarity in which a voltage at the gate of the ESD clamping device is more negative than a voltage at a source of the ESD clamping device, and
   wherein electrical energy for the negative voltage to the gate is generated, at least in part by the ESD pulse.

2. The method of claim 1, further comprising, in response to detecting the ESD pulse, applying, by the ESD protection circuit, a positive voltage to a gate of an ESD clamping device at a second time prior to the first time, wherein in response to receiving the positive voltage at the gate the ESD clamping device enters a parasitic bipolar mode.

3. The method of claim 1, wherein detecting the ESD pulse comprises determining by the ESD protection circuit, that a rise time that satisfies a rise time threshold.

4. The method of claim 2, wherein the ESD protection circuit determines the first time and the second time based on a resistor-capacitor (RC) time constant.

5. The method of claim 1, wherein the negative voltage to the gate of the ESD clamping device protects the ESD clamping device from leakage.

6. A charge pump circuit comprising:
an output element;
an energy storage element comprising a first terminal and a second terminal, wherein the first terminal of the energy storage element connects to the output element; and
a driver circuit configured to:
    charge the energy storage element from a supply voltage at a first time;
    switch the second terminal such that the first terminal of the energy storage element outputs a positive voltage at the first time and outputs a negative voltage at a second time.

7. The charge pump circuit of claim 6, wherein the source of the supply voltage comprises an electrostatic discharge (ESD) pulse.

8. The charge pump circuit of claim 6, wherein the energy storage element is a capacitor.

9. The charge pump circuit of claim 6, wherein the driver circuit comprises:
a first switch, wherein the first switch connects the supply voltage to the second terminal of the energy storage element; and
a second switch, wherein the second switch connects the second terminal of the energy storage element to a ground.

10. The charge pump circuit of claim 6, further comprising a semi-conductor element configured to allow charging current for the energy storage element to flow in only one direction and wherein a first terminal of the semi-conductor element connects to the first terminal of the energy storage element.

11. The charge pump circuit of claim 10, wherein the semi-conductor element is a diode.

12. An electrostatic discharge (ESD) protection circuit, the circuit comprising:
an ESD clamping device comprising a gate and a conduction path, wherein the conduction path connects a circuit power supply to a circuit ground; and
a charge pump circuit comprising:
    an output element, wherein the output element of the charge pump circuit connects to the gate of the ESD clamping device;
    an energy storage element comprising a first terminal and a second terminal,
        wherein a first terminal of the energy storage element connects to the output element; and a driver circuit configured to:
        charge the energy storage element from a supply voltage at a first time; and
        switch the second terminal such that the first terminal of the energy storage element outputs a positive voltage to the gate at the first time and outputs a negative voltage to the gate at a second time.

13. The circuit of claim 12, further comprising an ESD event detector, which includes a timer circuit, wherein the ESD event detector is configured to:
    in response to an ESD event at the circuit power supply, trigger the charge pump circuit to output the positive voltage at the first time and triggers the charge pump circuit to output the negative voltage at the second time,
    wherein the second time is subsequent to the first time and wherein the first time and the second time is based on the timer circuit.

14. The circuit of claim 13, wherein the ESD clamping device is an n-type metal oxide semiconductor (NMOS) field effect transistor (FET).

15. The circuit of claim 14, wherein the positive voltage at the first time causes the NMOS-FET to enter a parasitic bipolar mode.

16. The circuit of claim 12, wherein the ESD event comprises electrical energy and wherein the ESD protection circuit uses the electrical energy to activate the charge pump circuit and charge the energy storage element.

17. The circuit of claim 12, wherein:
the positive voltage to the gate at a first time is a trigger voltage, wherein the ESD clamping device, in response to the trigger voltage, enters a parasitic bipolar mode, and
the negative voltage is more negative than a voltage at a source terminal of the ESD clamping device at the second time.

18. The circuit of claim 12, wherein the output element, the energy storage element and driver circuit of the charge pump circuit comprises a first stage of the charge pump circuit; the charge pump circuit further comprising a second stage, including:
a second energy storage element;
a second driver circuit, and
a second output element, wherein a first terminal of the second energy storage element connects to the gate of the ESD clamping device.

19. The circuit of claim 12, further comprising a resistor connected between the driver circuit and the output element, in parallel to the second energy storage element, wherein the resistor is configured to prevent a gate voltage of the ESD clamping device from freely floating.

20. The circuit of claim 12, wherein the energy storage element is a capacitor.

* * * * *